(12) United States Patent
Hamamoto et al.

(10) Patent No.: US 6,479,827 B1
(45) Date of Patent: Nov. 12, 2002

(54) IMAGE SENSING APPARATUS

(75) Inventors: Osamu Hamamoto, Isehara; Noriyuki Kaifu, Hachioji; Kazuaki Tashiro, Hadano; Osamu Yuki, Atsugi; Kenji Kajiwara, Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 09/605,371

(22) Filed: Jun. 29, 2000

(30) Foreign Application Priority Data

Jul. 2, 1999 (JP) ............................................ 11-189312
Jun. 15, 2000 (JP) ........................................ 2000-180253

(51) Int. Cl.[7] ............................................... G01J 27/00
(52) U.S. Cl. ............................... 250/370.11; 250/370.1; 250/370.08; 250/370.09; 250/370.01; 250/338.4; 250/368
(58) Field of Search ........................ 250/370.11, 370.1, 250/368, 370.01, 370.08, 367, 338.4; 385/115, 88

(56) References Cited

U.S. PATENT DOCUMENTS 5,563,414 A    10/1996  Sklebitz ........................ 250/368
5,572,034 A  * 11/1996  Karellas ....................... 250/368
5,784,432 A  *  7/1998  Kurtz et al. ................. 250/367

* cited by examiner

*Primary Examiner*—Scott J. Sugarman
*Assistant Examiner*—M. Hasan
(74) *Attorney, Agent, or Firm*—Fitzpatrick, Cella, Harper & Scinto

(57) ABSTRACT

An image sensing apparatus is constructed in the optimum structure for provision of a wide photoreceptive area and has a plurality of solid state image sensing devices, each having a photoreceptive area comprising a plurality of photoelectric conversion elements, and a plurality of optical fiber plates for guiding light to the respective solid state image sensing devices, wherein the optical fiber plates are of a configuration for guiding light obliquely relative to a direction normal to an incidence plane of light of the optical fiber plates and toward the periphery of the solid state image sensing devices to which the optical fiber plates guide the light.

21 Claims, 9 Drawing Sheets

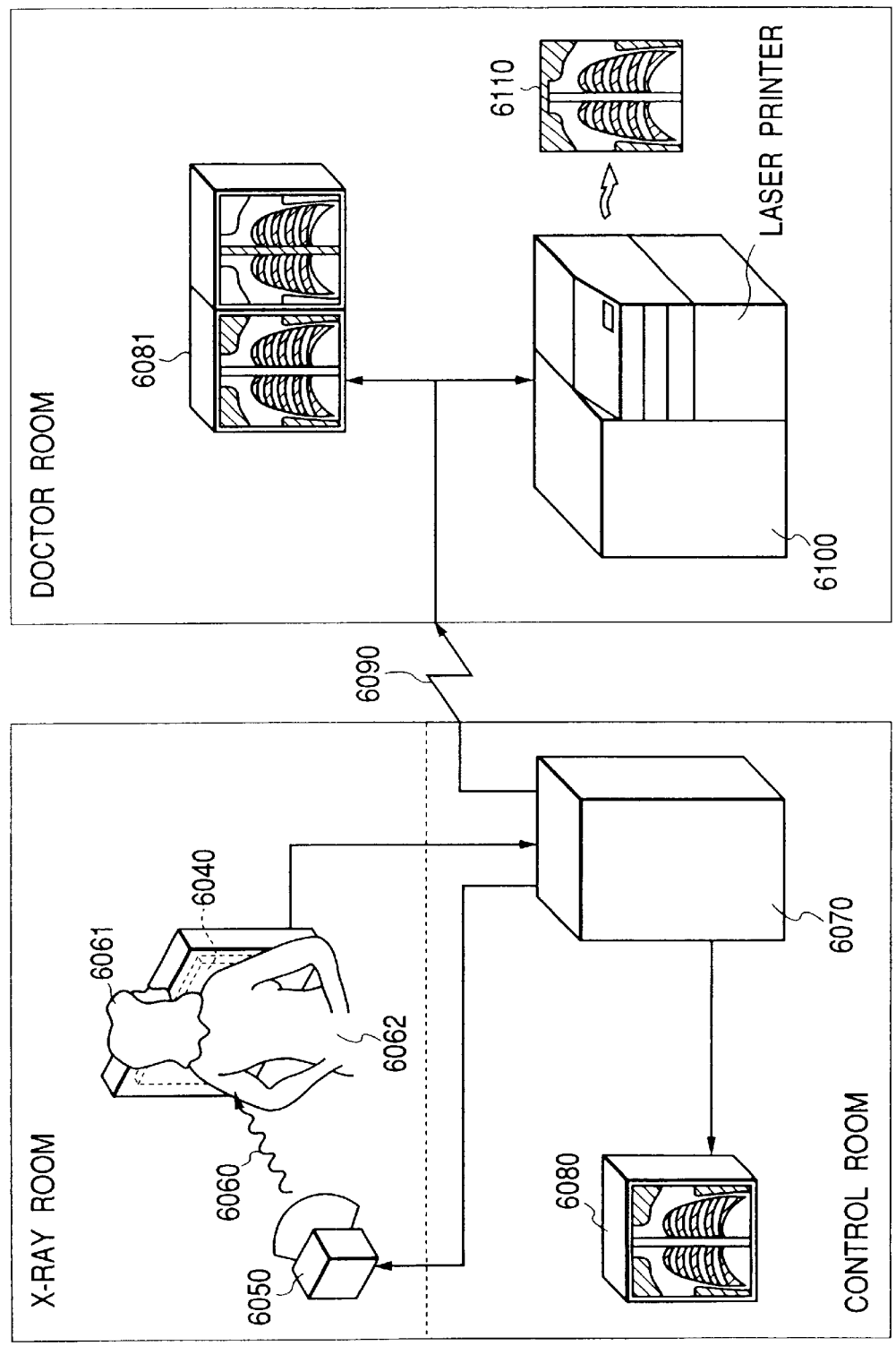

IMAGE SENSING APPARATUS

BACKGROUND OF THE INVENTION

1. Field of the Invention

The present invention relates to an image sensing apparatus having the photoelectric conversion function.

2. Related Background Art

A film screen system as a combination of an intensifying screen with an X-ray photograph film is often used for X-ray sensing intended for medical diagnosis.

In this method, X-rays having passed through the subject include information about the interior of the subject, they are converted to visible light proportional to the intensity of the X-rays by the intensifying screen, and the X-ray film is exposed to the visible light.

Recently, use is being started of X-ray digital sensing apparatus for converting X-rays to visible light in proportion to the intensity of the X-rays by a phosphor, converting the visible light to electric signals by use of photoelectric conversion elements, and converting them to digital signals by an A/D converter.

Examples of such apparatus proposed heretofore are the X-ray digital sensing device in which an image sensing device is constructed as a matrix array of elements wherein an amorphous semiconductor is placed between electrodes on a substrate of glass and in which the phosphor for converting X-rays to visible light is further deposited thereon; the X-ray digital sensing device which uses tapered optical fibers obtained by softening a bundle of optical fibers by heat or the like and stretching them and which is composed of two-dimensionally connected modules, each module having such structure that a solid state image sensing device such as a CCD sensor or the like is placed on the narrow side of the tapered shape while the phosphor is deposited on the other side of the tapered optical fiber; and so on.

The X-ray digital sensing devices as described above are mainly utilized for medical diagnosis etc. and, for early discovery of abnormal part and accurate diagnosis, there are increasing demands for higher resolution, lower noise, moving picture, wider sensing area, and so on.

However, the X-ray digital sensors described as the above conventional examples had the following problems.

In the case of the apparatus using the semiconductors comprised of amorphous silicon etc. on the glass substrate, it was possible to set a large photoreceptive area for photoelectric conversion, but it was hard in terms of processes and device characteristics to make the size of pixels finer.

In the case of the apparatus using the solid state image sensing devices of the silicon substrate, such as the CCD sensors or the like, it was possible to make the pixel size finer and it was also easy to perform the sensing of dynamic picture because of the feasibility of high-sensitivity and high-speed driving. It was, however, impossible to realize the large photoreceptive area because of the process constraints.

There are thus sensing systems in which the photoreceptive area is expanded by increasing the number of solid state image sensors by use of optical fibers tapered so as to prevent non-photoreceptive regions of the solid state sensors from overlapping with each other, as illustrated in FIG. 1.

In FIG. 1, reference numeral 1 designates the solid state image sensing devices, each consisting of a photoreceptive area in which a plurality of photoelectric conversion elements are arranged, 4 a scintillator for converting X-rays to light, such as visible light or the like, of wavelengths that can be detected by the photoelectric conversion elements, 8 the tapered optical fibers, 10 protective glass sheets, 11 bonding wires, and 12 ceramic packages.

The tapered optical fibers are, however, expensive and have some thickness and weight. It is thus possible to use several fibers in parallel, but there will arise a problem if they are used in the number enough to obtain the photoreceptive area necessary for sensing of chest part.

These problems made it difficult to realize all the performance including the higher resolution, the dynamic picture, etc., the wider photoreceptive area, the smaller size of apparatus, and the lower cost, demanded for the X-ray digital sensing apparatus for medical diagnosis.

SUMMARY OF THE INVENTION

An object of the present invention is to provide an image sensing apparatus of optimum structure for attainment of the wider photoreceptive area.

In order to accomplish the above object, an embodiment of the present invention provides an image sensing apparatus comprising:

a plurality of solid state image sensing devices, each having a photoreceptive area comprising a plurality of photoelectric conversion elements; and lightguide means comprising a plurality of lightguide portions, each guiding light to a corresponding one of said plurality of solid state image sensing devices, wherein said lightguide portions comprise a configuration for guiding light obliquely relative to a direction normal to an incident plane of light of said lightguide portions and to the direction where incident light radiates.

The other objects and features of the present invention will become more apparent by the description of the specification and drawings which follows.

BRIEF DESCRIPTION OF THE DRAWINGS

FIG. 17 is an X-ray diagnosis system of Embodiment 3.

DESCRIPTION OF THE PREFERRED EMBODIMENTS

The embodiments of the present invention will be described below with reference to the drawings. The image sensing apparatus of the present invention can be suitably applicable to radiation detectors including the X-ray detecting devices etc., but it is noted that the use thereof is not limited to the radiation detectors such as the X-ray detectors and the like.

The first embodiment will be described below.

Figure 1:
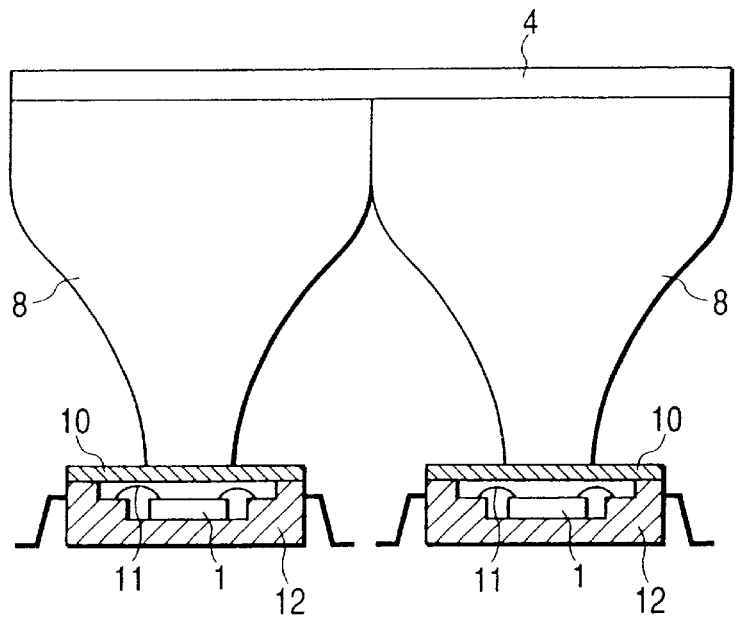
FIG. 1 is a drawing to show the conventional image sensing apparatus.
Figure 2:
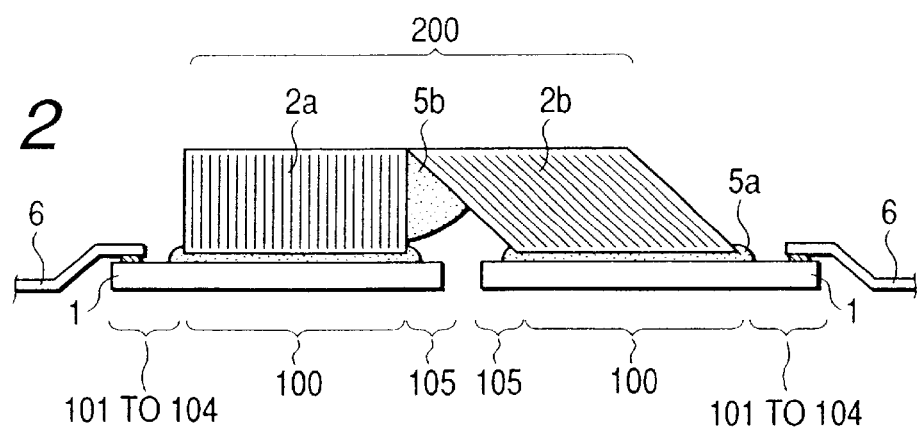
FIG. 2 is a cross-sectional view of the image sensing apparatus of Embodiment 1.
Figure 3:
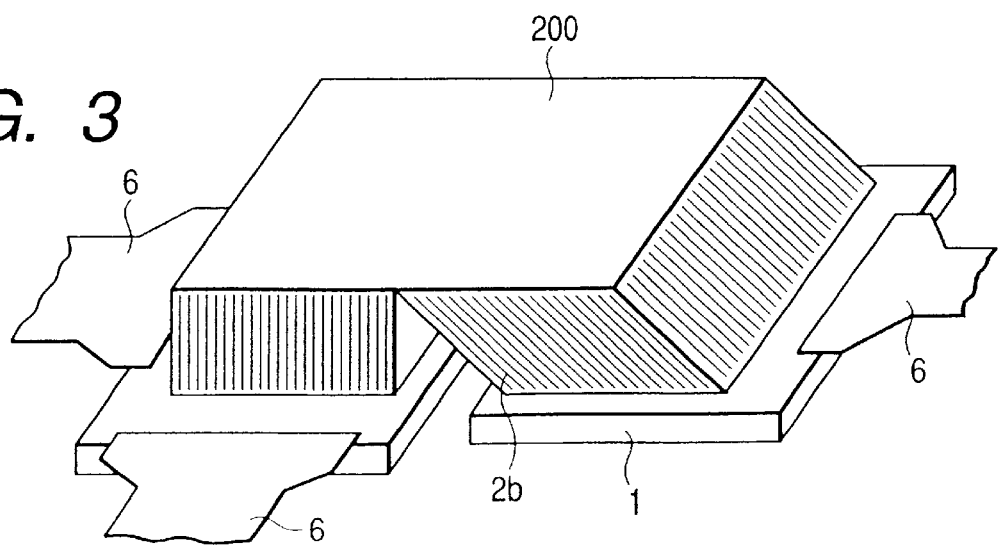
FIG. 3 is a perspective view of the image sensing apparatus of Embodiment 1.

FIG. 2 is a cross-sectional view of the image sensing apparatus in the first embodiment and FIG. 3 is a perspective view thereof.

In FIG. 2 and FIG. 3, reference numeral 1 designates the solid state image sensing devices, 100 the photoreceptive areas in each of which photoelectric conversion elements are arranged two-dimensionally, numerals 101 to 104 drive processing circuits, for example, such as vertical shift registers, horizontal shift registers, etc. for reading signals out of the photoelectric conversion elements, signal processing circuits for processing the signals obtained from the photoreceptive areas, and regions including external input/output terminals etc. respectively, and 2a and 2b optical fiber plates having different angles of optical axes of fibers relative to the entrance/exit plane. Numeral 200 represents the overall photoreceptive region of the solid state image sensing devices.

The optical fiber plates 2a, 2b used herein are those obtained by hot-pressing a bundle of optical fibers each in the diameter of about 5 to 6 μm and thereafter slicing it into plates having the necessary fiber axis angles. The optical fiber plate 2a is cut out so as to have the angle of 90° relative to the entrance/exit plane, while the optical fiber plate 2b is cut out so as to have the angle of 45°. The optical fibers are selected so that the fiber diameter can realize a resolution sufficiently smaller than that of the photoelectric conversion elements.

Further, 5a indicates a transparent adhesive for adhesion between the solid state image sensing devices 1 and the optical fiber plates 2a, 2b. Symbol 5b denotes a transparent adhesive for adhesion between modules.

Numeral 6 designates flexible printed circuit boards (FPC) for electrically connecting the external I/O terminals of the solid state image sensing devices to an image processing system.

Figure 4:
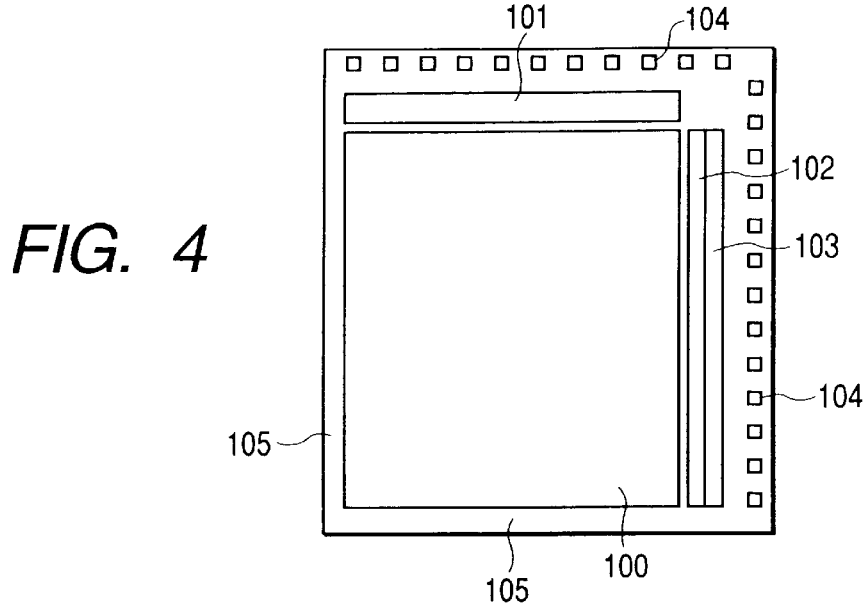
FIG. 4 is a detailed diagram of the solid state image sensing device being a part of the image sensing apparatus of Embodiment 1 or Embodiment 2.

FIG. 4 is a plan view to show a solid state image sensing device 1. Numeral 100 indicates the photoreceptive area in which photoelectric conversion elements each 100 μm square are arranged two-dimensionally and up to the edge of the solid state image sensing device.

Numeral 101 represents a vertical driving circuit (V-SR), 102 a horizontal scanning circuit (H-SR), 103 memory and amplifier circuits, and 104 electrode terminals which are placed along directions of two sides of the solid state image sensing device 1. Numeral 105 represents non-photoreceptive regions.

In the present embodiment, the optical fiber plate 2a having the same size as the photoreceptive area 100 of the above solid state image sensing device 1 and having the fiber axis angle of 90° is bonded to the photoreceptive area 100 with the transparent adhesive 5a. The optical fiber plate 2a is preliminarily cut out with accuracy by a dicer or the like so as to have the same area as the photoreceptive area 100 of the solid state image sensing device and is bonded to the photoreceptive area by use of an aligner capable of achieving alignment in the micrometer order.

Care has to be exercised to avoid including dust particles, bubbles, etc. in the transparent adhesive 5a between the optical fiber plate and the solid state image sensing device.

The flexible printed circuit boards (FPC) 6 are bonded to the electrode terminals 104 of the solid state image sensing device 1 with an anisotropic, electroconductive adhesive to establish electrical connections, thereby completing a module with the optical fiber plate having the axis angle of 90°.

In similar fashion the optical fiber plate 2b having the fiber axis angle of 45° is bonded to the solid state image sensing device 1 with the transparent adhesive 5a, so as to complete a module with the fiber plate having the axis angle of 45°.

Finally, the two modules are bonded to each other with the transparent adhesive 5b so that the light incidence surfaces of the optical fiber plates (the other surfaces than the bond surfaces of the solid state image sensing devices) in the photoelectric conversion modules of the axis angles of 90° and 45° are aligned in a common plane and so that there is no clearance between the modules.

Figure 5:
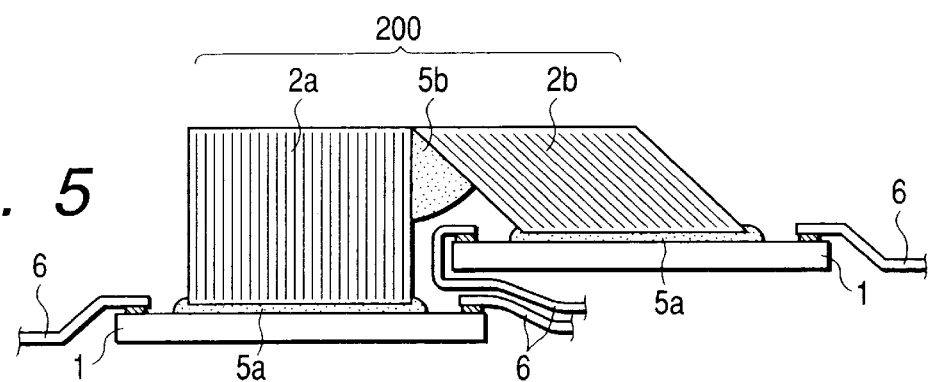
FIG. 5 is a cross-sectional view of the image sensing apparatus of Embodiment 1.

Further, the non-photoreceptive regions of the solid state image sensing devices 1 can be designed in a larger area or the fiber axis angle can be set to be close to 90° if the optical fiber plates of the respective modules have different thicknesses, as illustrated in FIG. 5. In FIG. 5, the thickness of the optical fiber plate 2b of the axis angle 45° is smaller than that of the optical fiber plate 2a of the axis angle 90°. It can also be contemplated that the thickness of the optical fiber plate 2b of the axis angle 45° is set to be larger than that of the optical fiber plate 2a of the axis angle 90° if necessary.

Figure 6:
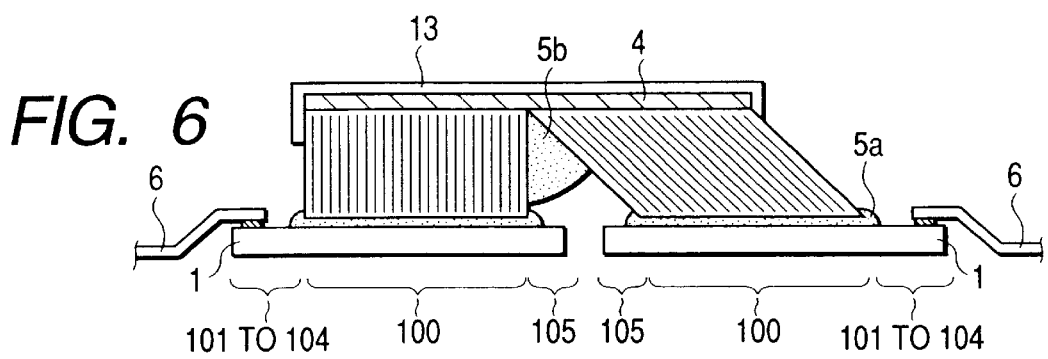
FIG. 6 is a cross-sectional view of the image sensing apparatus of Embodiment 1.

The X-ray image sensing apparatus, which is an X-ray detector, can be constructed by providing the above sensing apparatus with the scintillator 4 for converting X-rays to the light (for example, visible light) of wavelengths detectable by the photoelectric conversion elements, on the light incidence side (on the other surfaces than the bond surfaces of the photoelectric conversion elements) of the optical fiber plates 2a, 2b, as illustrated in FIG. 6.

The material for the scintillator is cesium iodide (CsI) or gadolinium sulfide ($Gd_2O_2S_2$) and is deposited by vacuum evaporation. Since the as-deposited layer is susceptible to breakage with a touch or to dissolution with moisture, it is desirable to protect the layer by an anti-moisture-permeable resin 13 or the like.

Figure 7:
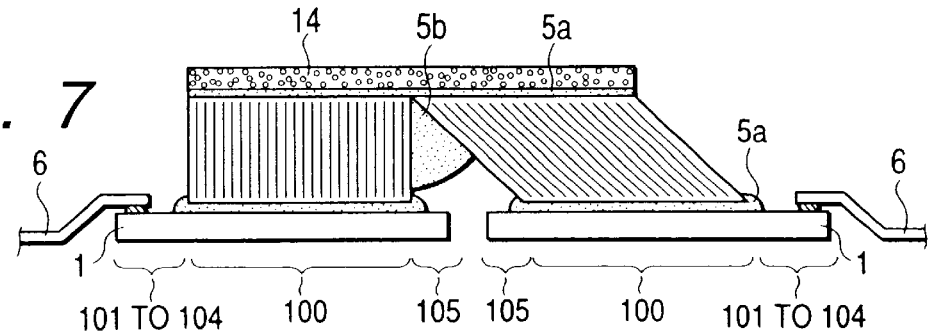
FIG. 7 is a cross-sectional view of the image sensing apparatus of Embodiment 1.

In another potential example, as illustrated in FIG. 7, a binder is blended in gadolinium sulfide powder, the mixture is processed in the film shape to form a fluorescent film 14, and the fluorescent film 14 is bonded to the optical fiber plates with the adhesive 5a.

The X-ray image sensing input apparatus of the present invention is constructed as described above.

The second embodiment of the present invention will be described below. The present embodiment is characterized by use of the optical fiber plates in such structure that the fiber axes of the optical fiber plates are not inclined only in one direction but are inclined at their respective axis angles in the X-direction and in the Y-direction with respect to the photoreceptive area plane in which the photoelectric conversion elements are arranged in the horizontal direction and in the vertical direction.

Figure 8A:
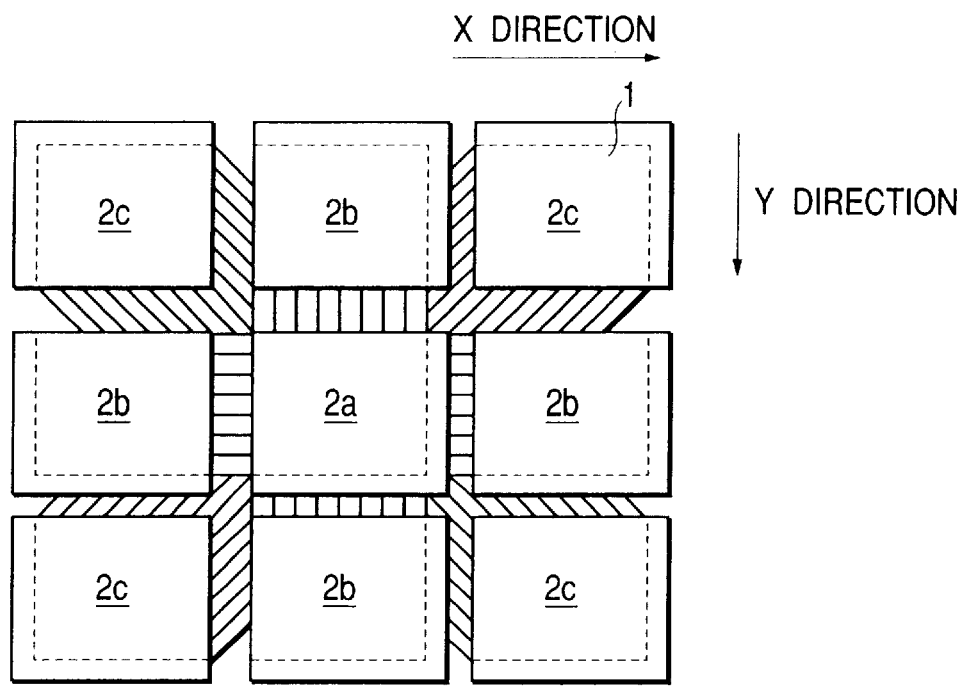
FIG. 8A and FIG. 8B are a bottom view and a side view of the image sensing apparatus of Embodiment 2.
Figure 8B:
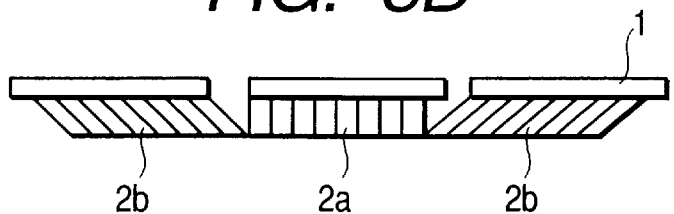
Figure 9:
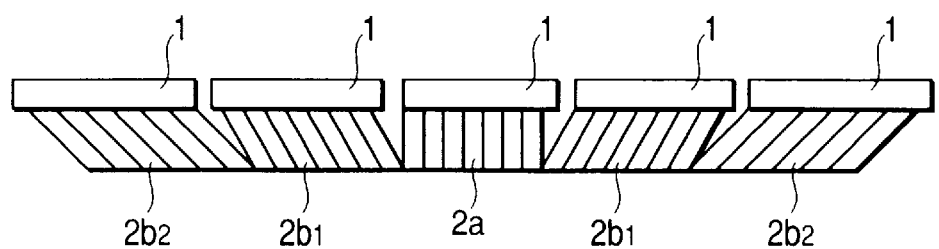
FIG. 9 is a cross-sectional view of the image sensing apparatus of Embodiment 2.

As illustrated in FIGS. 8A and 8B, nine solid state image sensing devices are bonded by use of thick optical fibers, whereby the image sensing apparatus can be fabricated with a much greater photoreceptive area. In this example, the optical fiber plates 2c are plates having the fiber axis inclined at 45° in the X-direction and also inclined at 45° in the Y-direction, as the optical fiber plates 2b are inclined at 45°. FIGS. 8A and 8B show the example in which there are one optical fiber plate 2a of the axis angle 90° in the center and eight optical fiber plates 2b, 2c around it, i.e., four optical fiber plates 2b having the axis angles of 45° and four optical fiber plates 2c having the axis angle of 45° in the X- and Y-directions, but it is noted that the present embodiment is not limited to only such a layout. For example, the apparatus can also be constructed in such a configuration that there are four optical fiber plates 2a with the axis angle of 90° in the central part (the area other than the periphery) and twelve optical fiber plates consisting of the optical fiber plates 2b having the axis angle of 45° and the optical fiber plates 2c having the axis angles of 45° in the X- and Y-directions. Another possible layout is, as illustrated in FIG. 9, such that around the optical fiber plate 2a with the axis angle of 90° in the center there are optical fiber plates $2b_1$ with the axis angle α1 (90°>α1) and optical fiber plates $2b_2$ with the axis angle α2 (α1>α2) in the decreasing order of axis angles toward the periphery.

Figure 10:
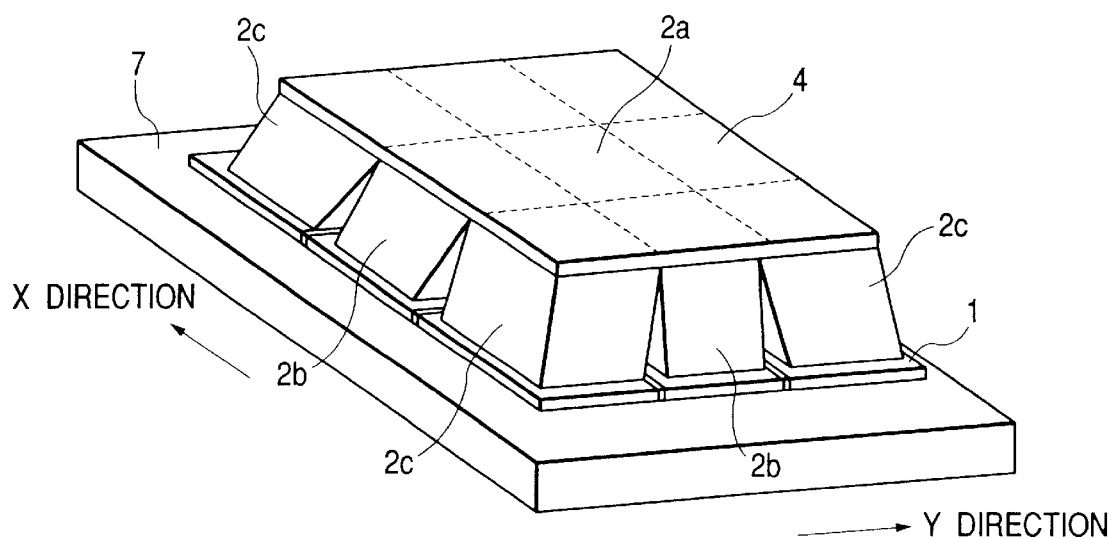
FIG. 10 is a perspective view of the image sensing apparatus of Embodiment 2.

FIG. 10 is a perspective view of the image sensing apparatus according to the present embodiment, in which 2c represents the optical fiber plates with the axis angles inclined both in the X- and Y-directions, 2b the optical fiber plates inclined either in the X-direction or in the Y-direction, and 2a the optical fiber plate approximately normal to the photoreceptive area plane.

Figure 11:
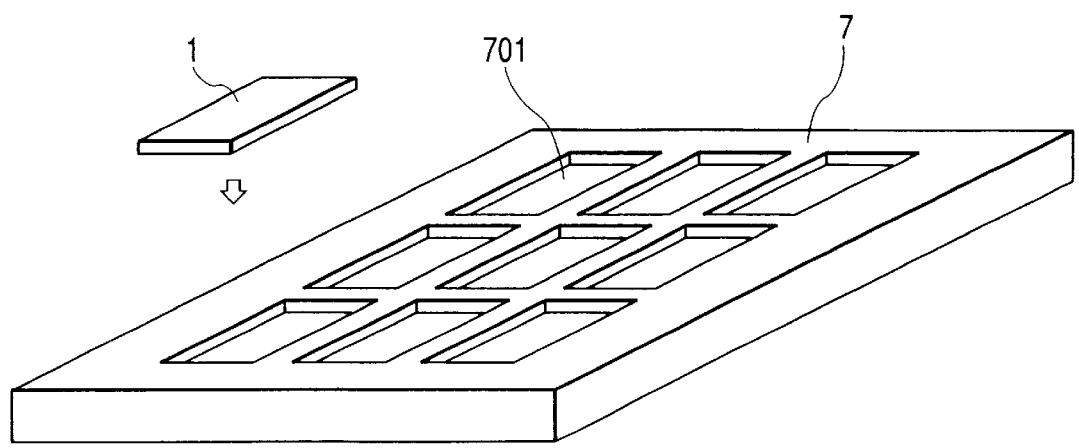
FIG. 11 is a diagram to show a circuit board being a part of the image sensing apparatus of Embodiment 2.

FIG. 11 shows a state in which the totally nine solid state image sensing devices are arranged in the matrix of three columns vertical and three rows horizontal on the circuit board 7. The details of each of the solid state image sensing devices are the same as those described referring to FIG. 4 in the first embodiment.

Figure 12:
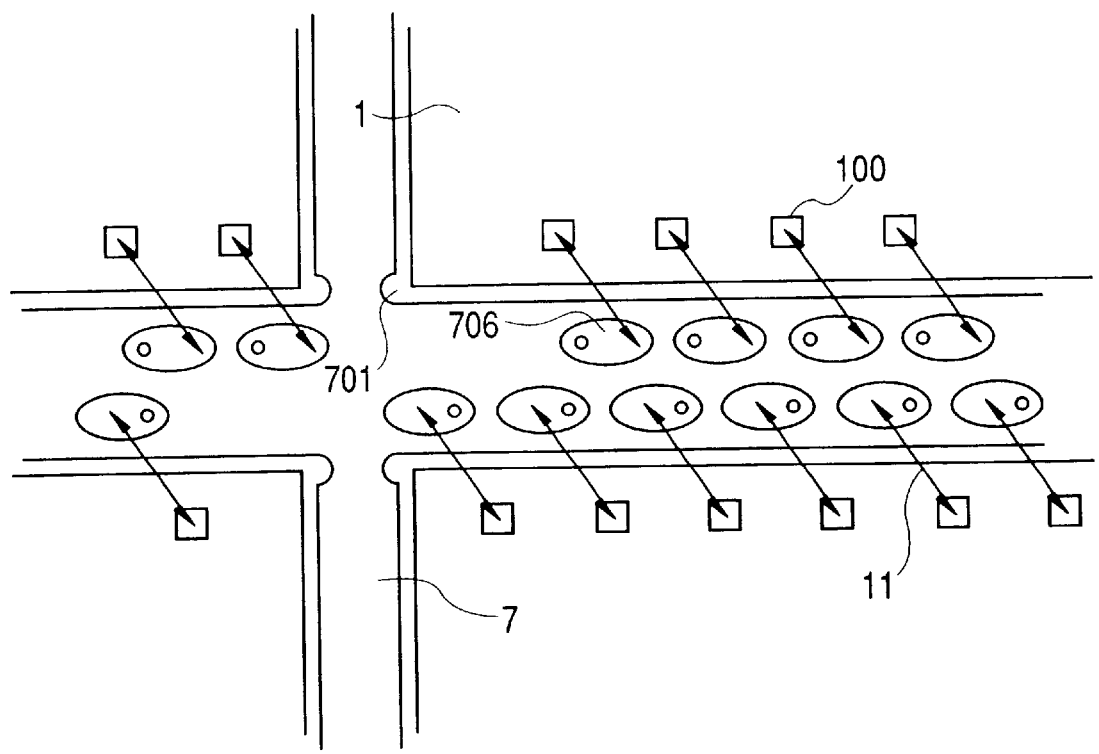
FIG. 12 is a detailed diagram of the circuit board being a part of the image sensing apparatus of Embodiment 2.

FIG. 12 is an enlarged view of the electrode part provided on the circuit board 7.

The circuit board 7 is a printed circuit board comprised of a plurality of glass fabric based epoxy layers and a plurality of copper foil layers, and electrode pads 705 for connection to the I/O terminals 104 of the solid state sensing devices 1 are formed on the surface for mounting of the solid state sensing devices 1. The electrode pads 705 are given soft gold plating through nickel plating.

Figure 13:
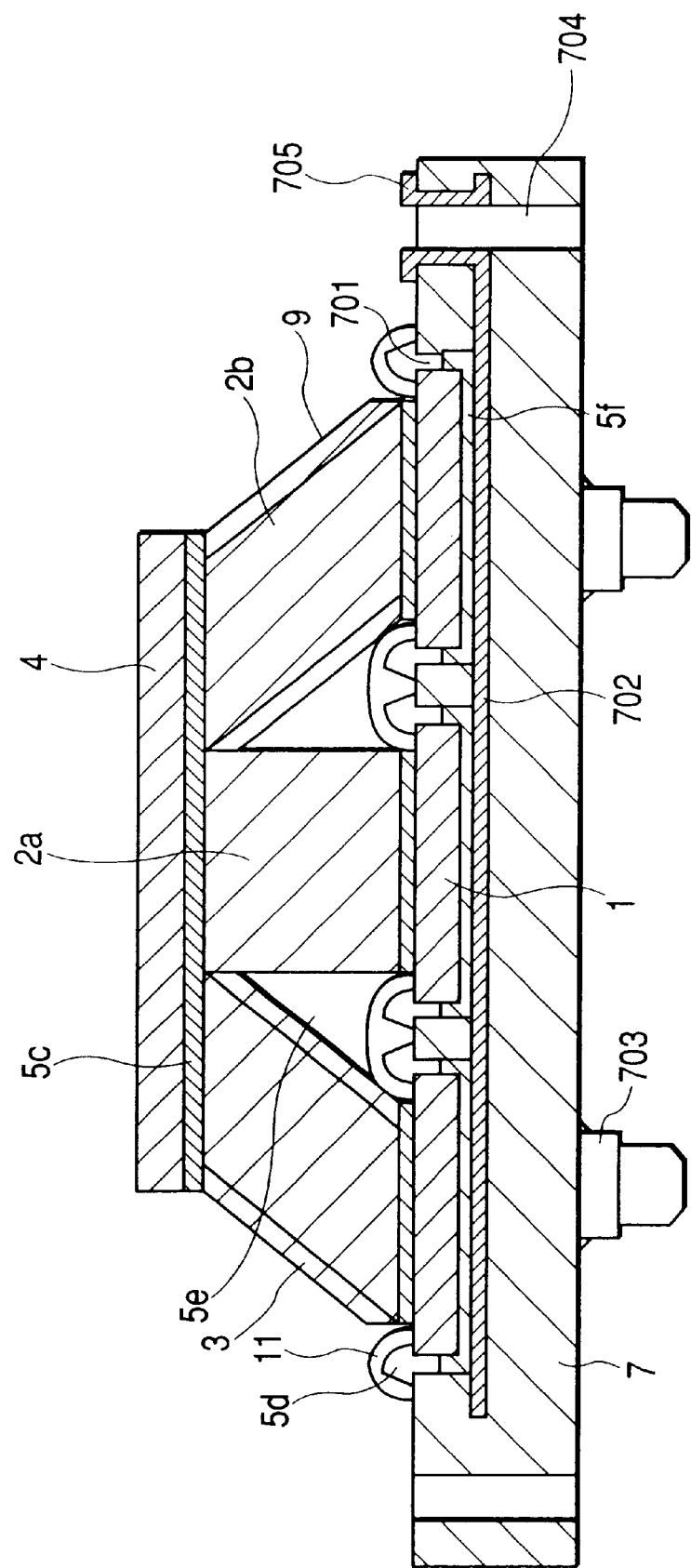
FIG. 13 is a cross-sectional view of the image sensing apparatus of Embodiment 2.

FIG. 13 is a cross-sectional view of the image sensing apparatus of the present embodiment.

Electrical connections are established between the I/O terminals 104 of the solid state image sensing devices 1 and the electrode pads 705 on the circuit board 7 by bonding wires 11. The bonding wires 11 are protected by a silicone sealer 5d. Since the electrical connection areas are in gaps between the optical fiber plates having the different inclination angles, no problem is posed by the height of the bonding wires 11 and the height of the sealer resulting from the establishment of electrical connections. In the present embodiment the sealing height including the wire is 0.6 mm.

Counterbores 701 for reception of the solid state image sensing devices 1 are formed in the surface of the circuit board 7 for mounting of the solid state image sensors 1. The reason why the counterbores 701 are provided is that they can suppress variation in the positional relation among the solid state image sensors 1 and shorten the wire lengths of the bonding wires 11. Namely, the shorter the distance between the solid state image sensors 1, the smaller the inclination of the axes of the optical fiber plates with the inclined axes become; or the thickness of the optical fiber plates can be made thinner.

Since the axis angles and thickness of the optical fiber plates affect the performance and cost of the optical fiber plates, the distance is designed to be as short between the solid state image sensors 1 as possible, without degrading the stability of wire bonding operation and connection strength.

The depth of the counterbores 701 is determined as the depth of 0.7 mm resulting from addition of the thickness of the solid state image sensors 1, 0.625 mm, to the thickness of the adhesive layer, 0.075 mm, so that the I/O terminals 104 of the solid state image sensors 1 and the electrodes 705 of the circuit board 7 may have the same height.

Further, the circuit board is designed so as to expose the second copper foil layer of the circuit board 7 when the counterbores are formed in the thickness of 0.7 mm from the surface of the circuit board 7. The second copper foil layer is a solid plane pattern except for through-hole part and is connected to the casing ground (GND). The solid state image sensors 1 are bonded and fixed through a heat-radiating adhesive 5f to this second heat-radiating pattern 702 of the circuit board 7, whereby heat is radiated from the solid state image sensors 1.

Specifically, using SE4420 available from Toray Dow Corning Silicone, the heat-radiating adhesive 702 is delivered into the counterbores of the circuit board 7 and then the solid state image sensors 1 are placed in the respective counterbores 701. Thereafter, while the solid state image sensors 1 are pressed simultaneously by a thick glass sheet with high rigidity, the heat-radiating adhesive 702 is hardened, with consideration to alignment of the surfaces of the respective solid state image sensors 1 at an equal height. This prevents occurrence of variation in clearances between the solid state image sensors 1 and the optical fiber plates assembled later, thereby suppressing occurrence of resolution unevenness. If the apparatus is constructed so as to be able to always exert some load on the devices after assembled into the casing, the clearance variation can be absorbed by the adhesive with elasticity.

For the optical fiber plates, the size and the axis angles of inclination of the fibers are determined depending upon the positional relation among the solid state image sensors 1 and the size of the photoreceptive area 100 of the solid state image sensors 1 illustrated in FIG. 11. The effective size of each optical fiber plate is designed to be smaller than the photoreceptive area 100 so that the image information in the input plane of the optical fiber plate can be always taken in even with some positional deviation between the photoreceptive area 100 of the solid state image sensor 1 and the optical fiber plate. For example, the photoreceptive area is 22.6 mm×15.1 mm, whereas the effective area of the optical fiber plates is 22.2 mm×14.6 mm, having the margin of about 0.2 mm in the periphery.

Figure 14:
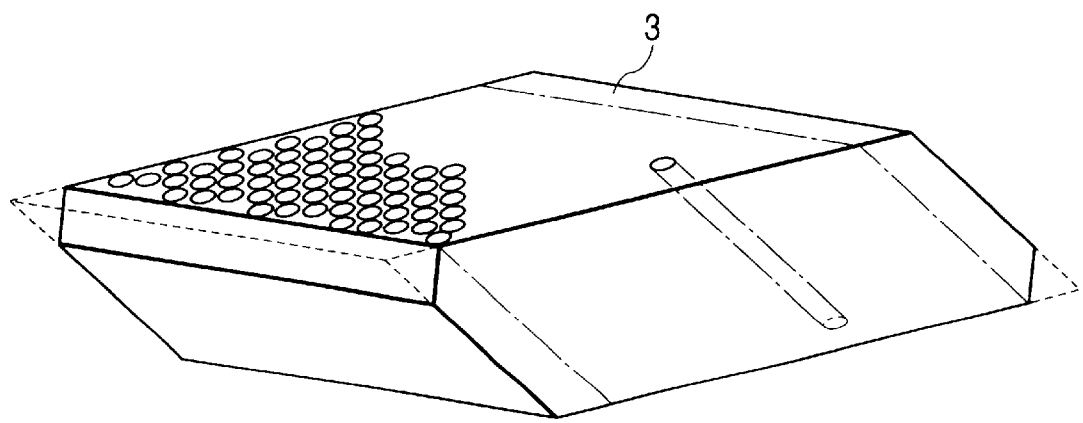
FIG. 14 is a diagram to show an optical fiber plate being a part of the image sensing apparatus of Embodiment 2.

Therefore, the optical fiber plate 2a in the central part has the effective area or outside size of 22.2 mm×14.6 mm. The optical fiber plates 2b except for that in the central part have sharp corners because of the inclination of the axis angles as illustrated in FIG. 14. Since it is hard to process such portions with accuracy and they are likely to become chipped, the sharp portions are chamfered. The effective area becomes narrower by the area of the chamfered portions, so as to form non-propagation areas 3. Therefore, the size of the optical fiber plates is increased by the area of such regions 3.

For example, FIG. 14 shows an optical fiber plate fabricated this time. Since the clearance is designed as 5 mm between the photoreceptive areas 100 of the solid state image sensors 1, the inclination of the axis angle is set to 20° and the thickness of the optical fiber plate to 13.7 mm (=5mm/tan 20). The portions other than the input/output surfaces and the chamfered portions of the optical fiber plate were provided with a black antidiffusion film for avoiding a malfunction due to scattered light or peripheral light. Specifically, the antidiffusion film was made of epoxy ink 1620 available from Seiko Advance. The production method of the optical fiber plate was similar to that described in Embodiment 1, and the fibers used were those having the fiber diameter of 15 µm and NA of 0.9 (FOW available from Nissei Denki).

Next, each of the optical fiber plates was bonded to the predetermined solid state image sensor 1. The adhesive 5a selected herein was the material excellent in optical transparency and having the refractive index close to that of the cores of the optical fibers and that of SiN film in the surface of the photoelectric conversion elements. Specifically, the material used was Worldlock 8740 (the transmittance 99% at 500 nm; the refractive index 1.592) available from Kyoritsu Kagaku.

First, the optical fiber plate 2a without inclination of the optical axis was bonded and fixed to the center solid state image sensor 1 and the other optical fiber plates were assembled without a gap along the optical fiber plate 2a and then bonded and fixed to the corresponding sensors. The bonding was carried out by a method of dropping the adhesive approximately onto the center of the photoreceptive area 100 of each solid state image sensor 1, placing a corresponding optical fiber plate thereon, evacuating the adhesive so as to leave no bubble between the photoreceptive area 100 and the optical fiber plate, thereafter effecting temporary tacking with ultraviolet rays (3000 mJ/cm$^2$) so as to prevent positional deviation, repeatedly carrying out these works the number of optical fiber plates times, and finally curing the adhesive by heat (80° C./30 min).

After that, as illustrated in FIG. 13, an X-ray shielding member was charged into the gaps (mount areas) between the optical fiber plates 2. Specifically, the shielding member was a mixture of lead powder with silicone resin. The purpose of provision of the shielding member is to protect the solid state image sensors 1 from the X-rays through thin portions of the phosphor and the optical fiber plates 2.

Next, the phosphor sheet 4 of the size approximately equal to or a little larger than the size of the optical fiber plates 2 assembled was bonded to the optical fiber plates 2. In the present embodiment the phosphor sheet 4 used was a laminate film in which powder of gadolinium sulfide ($Gd_2O_2S_2$) was placed in the thickness of 200 µm between PET films. The adhesive 5c selected herein was a material being excellent in optical transparency and having the intermediate index of 1.6 between the refractive index of PET and the refractive index of the cores of the optical fiber plates (Worldlock XVL-14 available from Kyoritsu Kagaku). The adhesive 5c was cured while exerting a uniform load so as to prevent creation of a gap between the phosphor film and the optical fiber plates, thereby completing a sensor module.

Figure 15:
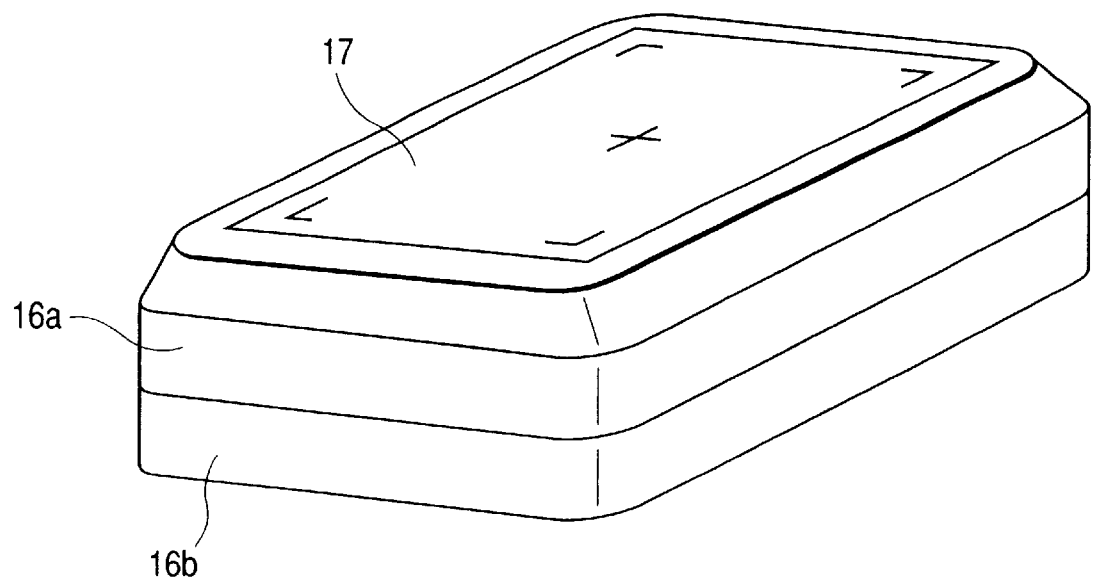
FIG. 15 is a perspective view of the image sensing apparatus of Embodiment 2.
Figure 16:
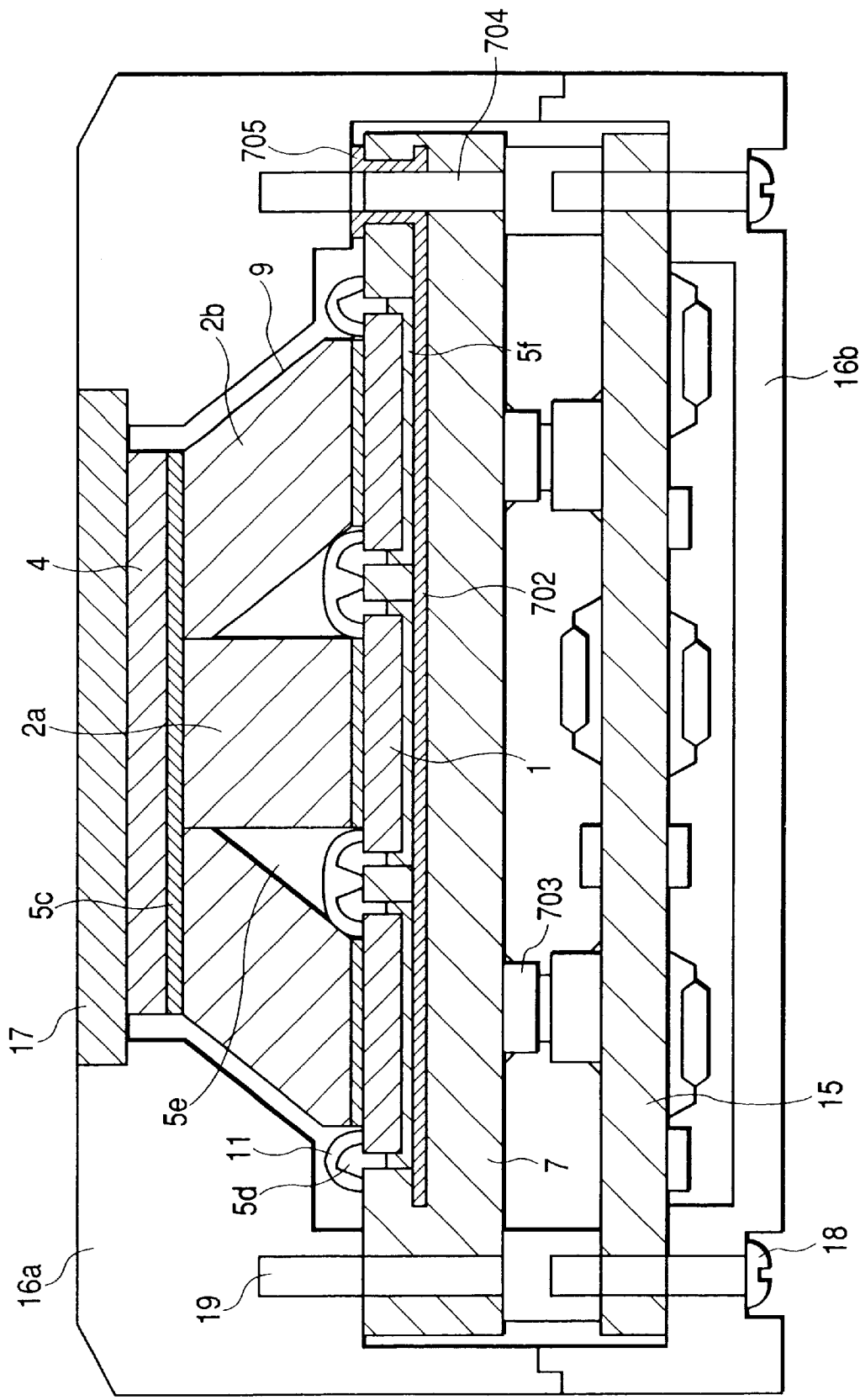
FIG. 16 is a cross-sectional view of the image sensing apparatus of Embodiment 2.

FIG. 15 is a perspective view of the image sensing apparatus thus completed and FIG. 16 a cross-sectional view thereof.

As illustrated in FIG. 16, the sensors are connected through interboard connectors 703, which are disposed on the mount surface for the solid state image sensing devices 1 in the circuit board 1 thus completed, to an A/D converter board 15. The A/D converter board 15 converts analog signals from the solid state image sensors 1 to 14-bit digital signals and supplies necessary power and timing signals to the solid state image sensors 1.

The whole image sensing apparatus is protected from external pressure, static electricity, etc. by the casing 16a, 16b of metal, and the portion of the casing corresponding to the photoreceptive area of the image sensing apparatus is made of carbon-fiber-reinforced plastic 17 (CFRP) with sufficient rigidity and with high X-ray transmittance.

As described above, Embodiments 1 and 2 present the following technological effects.

They can provide the image sensing apparatus with high definition and high sensitivity, in a low profile, and with a wide photoreceptive area.

Since the photoelectric conversion elements and the driving circuits and signal processing circuits for reading the signals from the photoelectric conversion elements are placed on the solid state image sensors, there is no need for connection of the gate lines, signal lines, etc. between the adjacent photoelectric conversion elements and thus the structure is simplified, so as to realize further reduction of cost.

Since the optical fibers are made of the material containing lead, the lead intercepts X-rays remaining without being converted to visible light by the phosphor layer, so as to reduce the influence of the remaining X-rays on the photoelectric conversion elements, whereby an image can be obtained without noise.

Since there are the clearances between the optical fiber plates, it is easy to establish the electrical connections of the input/output electrodes of the solid state image sensors. Since the connections can be made by the presently existing connection techniques, high reliability and low cost can be accomplished thereby.

In general, the embodiments can provide the X-ray image sensing apparatus available for highly accurate medical cares, while implementing both the performance of high resolution and dynamic picture and the demands for a wide sensor effective area and for reduction in the size and cost of apparatus, which have been demanded for the X-ray digital image sensing apparatus for medical diagnosis.

The third embodiment will be described below.

FIG. 17 shows an X-ray diagnosis system incorporating the image sensing apparatus described in Embodiment 1 and Embodiment 2.

X-rays 6060 generated in X-ray tube 6050 travel through the chest 6062 of patient or subject 6061 to enter the image sensing apparatus 6040 with the scintillator mounted thereon. The incident X-rays include information about the interior of the body of the patient 6061. With incidence of X-rays the scintillator emits light and this light is subjected to photoelectric conversion to obtain electrical information. This information is converted to digital signals and the digital signals are subjected to image processing by image processor 6070, whereby an image can be observed in a display 6080 in a control room.

This information can also be transferred to a remote place through a transmission means such as telephone circuit 6090 or the like and can be displayed on another display 6081 in a doctor room at another place or saved in a storage medium such as an optical disk or the like, thereby permitting the doctor at the remote place to make diagnosis. The information can also be recorded on a film 6110 by a film processor 6100.

The image sensing apparatus can also be applied to nondestructive inspection or the like, without having to be limited to the medical use.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image sensing apparatus comprising:
   a plurality of solid state image sensing devices, each including a photoreceptive area comprising a plurality of photoelectric conversion elements, wherein said plurality of solid state image sensing devices are arranged on different semiconductor substrates respectively;
   a plurality of optical fiber plates, each of which comprises a bundle of a plurality of optical fibers each guiding light from a light incidence plane to a light exit plane, wherein each of said plurality of optical fiber plates is arranged obliquely relative to a direction normal to the solid state image sensing device so that the light incidence plane is closer to the center of said image sensing apparatus than the light exit plane; and
   a radiation reduction member which reduces a radiation, said radiation reduction member being arranged in a space formed between the optical fiber plates.

2. The image sensing apparatus according to claim 1, wherein said plurality of solid state image sensing devices comprise a first solid state image sensing device and a second solid state image sensing device, and
   wherein said first solid state image sensing device is located at a position closer to said incidence plane than said second solid state image sensing device.

3. The image sensing apparatus according to claim 2, wherein said first solid state image sensing device is located at a position closer to the center of said plurality of solid state image sensing devices than said second solid state imaging sensing device.

4. The image sensing apparatus according to claim 2, wherein the optical fiber plates are so constructed that a portion for guiding light to said second solid state image sensing device is thicker than a portion for guiding light to said first solid state image sensing device.

5. The image sensing apparatus according to claim 1, wherein an area of a plurality of photoreceptive areas respectively included in said plurality of solid state image sensing devices is equal to an area of the incidence plane of light of said plurality of optical fiber plates.

6. The image sensing apparatus according to claim 1, wherein said plurality of solid state image sensing devices comprise a first solid state image sensing device and a second solid state image sensing device located at a position closer to the periphery than said first solid state sensing device,
   wherein an incidence angle of a lightguide portion for guiding light to said first solid state image sensing device is different from that of a lightguide portion for guiding light to said second solid state image sensing device, and said incidence angles are not normal to the incidence plane of light of said lightguide portions.

7. The image sensing apparatus according to claim 1, further comprising:
   connection means for establishing electrical connection between adjacent solid state image sensing devices,
   wherein said connection means is disposed in a clearance between said solid state image sensing devices and said lightguide portions.

8. The image sensing apparatus according to claim 1, further comprising:
   analog-to-digital converting means for converting an analog signal to a digital signal, disposed on the back surface side of said plurality of solid state image sensing devices.

9. The image sensing apparatus according to claim 1, further comprising:
   connection means for establishing electrical connection between adjacent solid state image sensing devices,
   wherein said connection means connects said photoreceptive area sides of said solid state image sensing devices.

10. The image sensing apparatus according to claim 1, wherein said lightguide portions comprise a configuration for guiding light in a direction normal to the incidence plane of light of said lightguide portions.

11. The image sensing apparatus according to claim 10, wherein said plurality of solid state image sensing devices comprise a first solid state image sensing device and a second solid state image sensing device, and
    wherein said first solid state image sensing device is located at a position closer to said incidence plane than said second solid state image sensing device.

12. The image sensing apparatus according to claim 11, wherein said first solid state image sensing device is located at a position closer to the center of said plurality of solid state image sensing devices than said second solid state imaging sensing device.

13. The image sensing apparatus according to claim 10, wherein a thickness of said lightguide portion of the configuration for guiding the light obliquely relative to the direction normal to the incidence plane of light of said lightguide portions and to the direction where incident light radiates is different from that of said lightguide portion of the configuration for guiding the light in the direction normal to the incidence plane of light of said lightguide portions.

14. The image sensing apparatus according to claim 10, wherein an area of a plurality of photoreceptive areas respectively included in said plurality of solid state image sensing devices is equal to an area of the incidence plane of light to said plurality of optical fiber plates.

15. The image sensing apparatus according to claim 10, wherein said plurality of solid state image sensing devices comprise a first solid state image sensing device and a second solid state image sensing device located at a position closer to the periphery than said first solid state sensing device, and
    wherein an incidence angle of a lightguide portion for guiding light to said first solid state image sensing device is different from that of a lightguide portion for guiding light to said second solid state image sensing device, and said incidence angles are not normal to the incidence plane of light to said lightguide portions.

16. The image sensing apparatus according to claim 10, further comprising:
   connection means for establishing electrical connection between adjacent solid state image sensing devices,
   wherein said connection means is disposed in a clearance between said solid state image sensing devices and said lightguide portions.

17. The image sensing apparatus according to claim 10, further comprising:
   analog-to-digital converting means for converting an analog signal to a digital signal, disposed on the back surface side of said plurality of solid state image sensing devices.

18. The image sensing apparatus according to claim 10, further comprising:
   connection means for establishing electrical connection between adjacent solid state image sensing devices,
   wherein said connection means connects said photoreceptive area sides of said solid state image sensing devices.

19. An image sensing system comprising:
   an image sensing apparatus including:
      a plurality of solid state image sensing devices, each including a photoreceptive area comprising a plurality of photoelectric conversion elements, wherein said plurality of solid state image sensing devices are arranged on different semiconductor substrates respectively,
      a plurality of optical fiber plates, each of which comprises a bundle of a plurality of optical fibers each guiding light from a light incidence plane to a light exit plane wherein each of said plurality of optical fiber plates is arranged obliquely relative to a direction normal to the solid state image sensing device so that the light incidence plane is closer to the center of said image sensing apparatus than the light exit plane,
      a radiation reduction member which reduces a radiation, said radiation reduction member being arranged in a space formed between the optical fiber plates, and
   converting means for converting the radiation to visible light;
   radiation means for making the radiation incident into said image sensing apparatus; and
   image processing means for subjecting a signal outputted from said image sensing apparatus, to image processing.

20. An image sensing apparatus comprising:
   a plurality of solid state image sensing devices each including a photoreceptive area comprising a plurality of photoelectric conversion elements, wherein said plurality of solid state image sensing devices are arranged on different semiconductor substrates respectively, with a space being interposed between the solid state image sensing devices,
   a plurality of optical fiber plates, each of which comprises a bundle of a plurality of optical fibers each guiding light from a light incidence plane to a light exit plane, wherein each of said plurality of optical fiber plates is arranged obliquely relative to a direction normal to the solid state image sensing device so that the light incidence plane is closer to the center of said image sensing apparatus than the exit plane; and
   a wiring arranged in the space interposed between the solid state image sensing devices, which connects electrically a pair of solid state image sensing devices.

21. An image sensing system comprising;
   an image sensing apparatus including:
      a plurality of solid state image sensing devices each including a photoreceptive area comprising a plurality of photoelectric conversion elements, wherein said plurality of solid state image sensing devices are arranged on different semiconductor substrates respectively, with a space being interposed between the solid state image sensing devices,
      a plurality of optical fiber plates, each of which comprises a bundle of a plurality of optical fibers each guiding light from a light incidence plane to a light exit plane, wherein each of said plurality of optical fiber plates is arranged obliquely relative to a direction normal to the solid state image sensing device so that the light incidence plane is closer to the center of said image sensing apparatus than the light exit plane,
      a wiring arranged in the space interposed between the solid state image sensing devices, which connects electrically a pair of solid state image sensing devices, and
   converting means for converting a radiation to visible light;
   radiation means for making the radiation incident into said image sensing apparatus; and
   image processing means for subjecting a signal outputted from said image sensing apparatus, to image processing.

* * * * *

UNITED STATES PATENT AND TRADEMARK OFFICE
CERTIFICATE OF CORRECTION

PATENT NO.     : 6,479,827 B1
DATED          : November 12, 2002
INVENTOR(S)    : Osamu Hamamoto et al.

It is certified that error appears in the above-identified patent and that said Letters Patent is hereby corrected as shown below:

<u>Title page,</u>
Item [*] Notice, "6 days." should read -- 0 days. --.

<u>Column 1,</u>
Line 24, "such apparatus" should read -- such apparatuses --.

<u>Column 6,</u>
Line 50, "devices after" should read -- devices after being --; and
Line 61, "be always" should read -- always be --.

<u>Column 12,</u>
Line 21, "system comprising;" should read -- system comprising: --.

Signed and Sealed this

Nineteenth Day of August, 2003

JAMES E. ROGAN
*Director of the United States Patent and Trademark Office*